US012380872B2

(12) United States Patent
Wang et al.

(10) Patent No.: US 12,380,872 B2
(45) Date of Patent: Aug. 5, 2025

(54) NOISE REDUCTION MODULE AND ELECTRONIC DEVICE

(71) Applicant: Wistron Corporation, New Taipei (TW)

(72) Inventors: Cheng-Pang Wang, New Taipei (TW); Guang-Zong Li, New Taipei (TW); Chieh-Yu Ma, New Taipei (TW); Chi-Ken Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 364 days.

(21) Appl. No.: 17/839,496

(22) Filed: Jun. 14, 2022

(65) Prior Publication Data

US 2023/0317044 A1  Oct. 5, 2023

(30) Foreign Application Priority Data

Apr. 1, 2022  (TW) .................................. 111112723

(51) Int. Cl.
*G10K 11/16* (2006.01)
*H05K 5/02* (2006.01)

(52) U.S. Cl.
CPC ........... *G10K 11/16* (2013.01); *H05K 5/0217* (2013.01)

(58) Field of Classification Search
CPC ......... G06F 1/20; G11B 33/08; G11B 33/128; G11B 33/142; G10K 11/16; H05K 7/20727; H05K 7/20145; H05K 5/0217; F04D 25/166; F04D 29/664; F04D 29/66; F24F 13/24
USPC ....................................................... 181/224
See application file for complete search history.

(56) References Cited

U.S. PATENT DOCUMENTS

| | | | | |
|---|---|---|---|---|
| 4,894,749 A * | 1/1990 | Elko | .......................... | G06F 1/20 165/104.33 |
| 8,144,465 B2 * | 3/2012 | Liang | ......................... | G06F 1/20 361/679.48 |
| 9,011,093 B2 * | 4/2015 | Mao | .................... | H05K 7/20172 415/213.1 |
| 9,036,344 B2 * | 5/2015 | Chen | ......................... | G06F 1/20 174/15.1 |
| 10,244,662 B2 * | 3/2019 | LaPree | ..................... | F24F 13/24 |
| 10,319,414 B2 * | 6/2019 | Paterra | ................. | G11B 33/022 |

(Continued)

FOREIGN PATENT DOCUMENTS

| | | |
|---|---|---|
| CN | 113638909 A | 11/2021 |
| CN | 113724678 A | 11/2021 |
| CN | 214787674 U | 11/2021 |

OTHER PUBLICATIONS

Wayback machine fan dimensions 40mm x 20mm (Year: 2019).*

*Primary Examiner* — Forrest M Phillips
*Assistant Examiner* — Joseph James Peter Illicete
(74) *Attorney, Agent, or Firm* — Winston Hsu

(57) ABSTRACT

A noise reduction module includes a casing, at least one sound weakening mechanism and at least one sound absorbing mechanism. The at least one sound weakening mechanism is disposed in the casing. Each of the at least one sound weakening mechanism includes two plate members and a passage is formed between the two plate members. The at least one sound absorbing mechanism is disposed in the casing. Each of the at least one sound absorbing mechanism includes a bracket and at least one first sound absorbing structure, and the at least one first sound absorbing structure is disposed on the bracket.

18 Claims, 7 Drawing Sheets

(56) References Cited

U.S. PATENT DOCUMENTS

| | | | |
|---|---|---|---|
| 10,388,327 B2* | 8/2019 | Eguchi | G11B 33/08 |
| 11,289,064 B2* | 3/2022 | Doglio | G10K 11/162 |
| 11,443,726 B2* | 9/2022 | Wu | G06F 1/182 |
| 2008/0151490 A1* | 6/2008 | Fan | G06F 1/20 |
| | | | 361/690 |
| 2014/0342652 A1* | 11/2014 | Dong | H05K 7/20145 |
| | | | 454/184 |
| 2023/0021389 A1* | 1/2023 | Chen | H05K 7/20727 |

* cited by examiner

NOISE REDUCTION MODULE AND ELECTRONIC DEVICE

BACKGROUND OF THE DISCLOSURE

1. Field of the Disclosure

The disclosure relates to a noise reduction module and, more particularly, to a noise reduction module capable of effectively attenuating airborne noise and an electronic device equipped with the noise reduction module.

2. Description of the Prior Art

As technology advances and develops, various electronic devices (e.g. computer, server, etc.) are considered a necessity by a lot of people in their daily lives. In general, the electronic device is equipped with a hard disk and a fan for dissipating heat from the hard disk. In recent years, it has been found that the airborne noise generated by the fan will affect the read/write performance of the hard disk, thereby degrading the performance of the hard disk. At present, the prior art adds a porous sound absorbing material (e.g. foam) between the fan and the hard disk to absorb the airborne noise. However, the porous sound absorbing material will increase the airflow resistance, thereby affecting the heat dissipation efficiency.

SUMMARY OF THE DISCLOSURE

The disclosure provides a noise reduction module capable of effectively attenuating airborne noise and an electronic device equipped with the noise reduction module, so as to solve the aforesaid problems.

According to an embodiment of the disclosure, a noise reduction module comprises a casing, at least one sound weakening mechanism and at least one sound absorbing mechanism. The at least one sound weakening mechanism is disposed in the casing. Each of the at least one sound weakening mechanism comprises two plate members and a passage is formed between the two plate members. The at least one sound absorbing mechanism is disposed in the casing. Each of the at least one sound absorbing mechanism comprises a bracket and at least one first sound absorbing structure, and the at least one first sound absorbing structure is disposed on the bracket.

According to another embodiment of the disclosure, an electronic device comprises at least one electronic unit, at least one airflow generating unit and at least one noise reduction module. The at least one airflow generating unit is disposed with respect to the at least one electronic unit. The at least one noise reduction module is disposed between the at least one electronic unit and the at least one airflow generating unit. Each of the at least one noise reduction module comprises a casing, at least one sound weakening mechanism and at least one sound absorbing mechanism. The at least one sound weakening mechanism is disposed in the casing. Each of the at least one sound weakening mechanism comprises two plate members and a passage is formed between the two plate members. The at least one sound absorbing mechanism is disposed in the casing. Each of the at least one sound absorbing mechanism comprises a bracket and at least one first sound absorbing structure, and the at least one first sound absorbing structure is disposed on the bracket.

As mentioned in the above, the disclosure utilizes the sound weakening mechanism to reduce the energy of the sound conducted to the electronic unit (e.g. hard disk) and utilizes the sound absorbing mechanism to absorb and reflect the energy of the sound, thereby reducing the energy of the sound. Accordingly, the airborne noise can be effectively weakened to prevent the performance of the electronic unit from being degraded by the airborne noise. Furthermore, the passage of the sound weakening mechanism can keep the percentage of open area of the noise reduction module at a specific percentage, so as to prevent the airflow resistance from greatly increasing to affect the heat dissipation efficiency.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
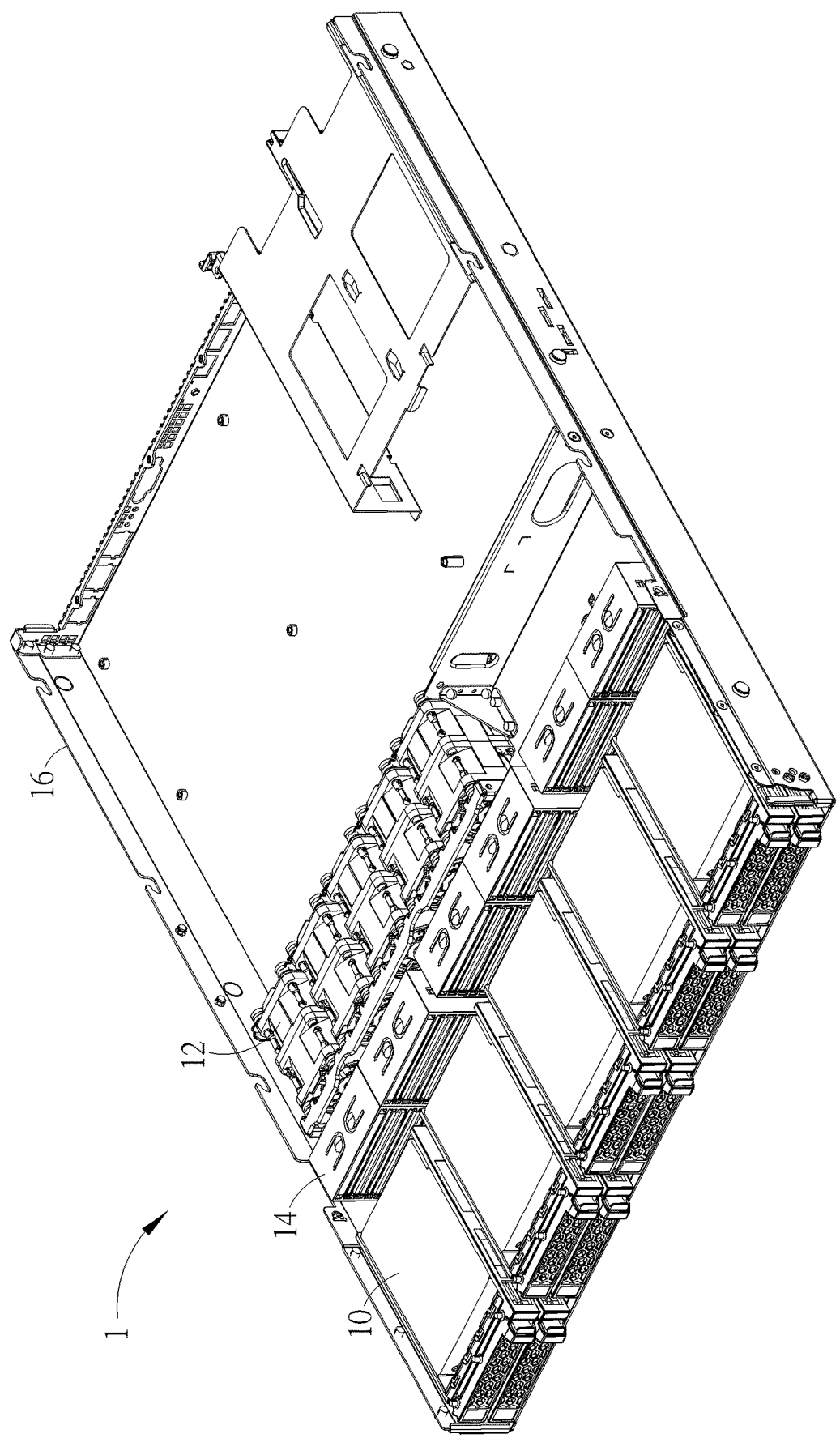
FIG. 1 is a perspective view illustrating an electronic device according to an embodiment of the disclosure.
Figure 2:
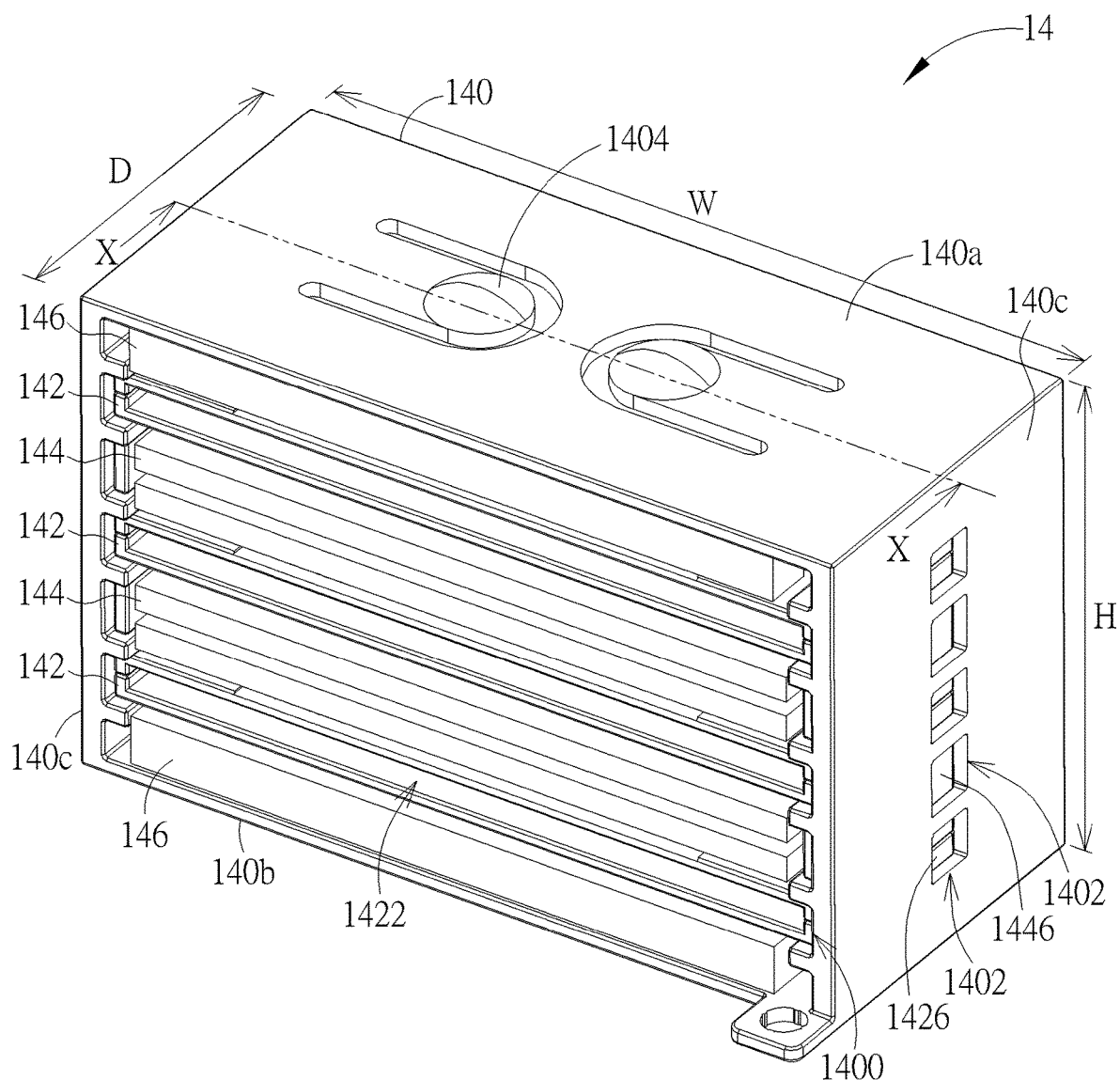
FIG. 2 is a perspective view illustrating a noise reduction module shown in FIG. 1.
Figure 3:
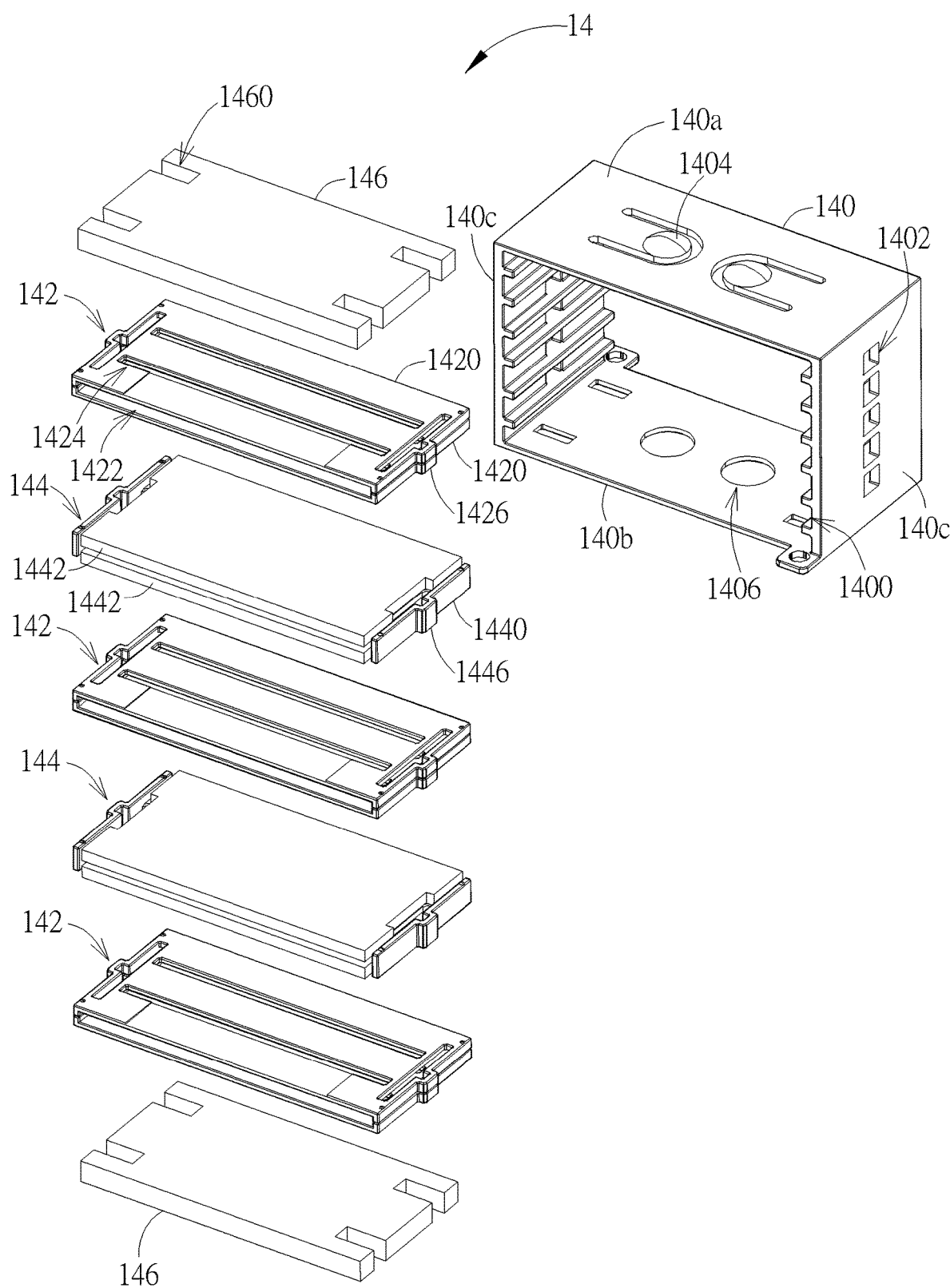
FIG. 3 is an exploded view illustrating the noise reduction module shown in FIG. 2.
Figure 4:
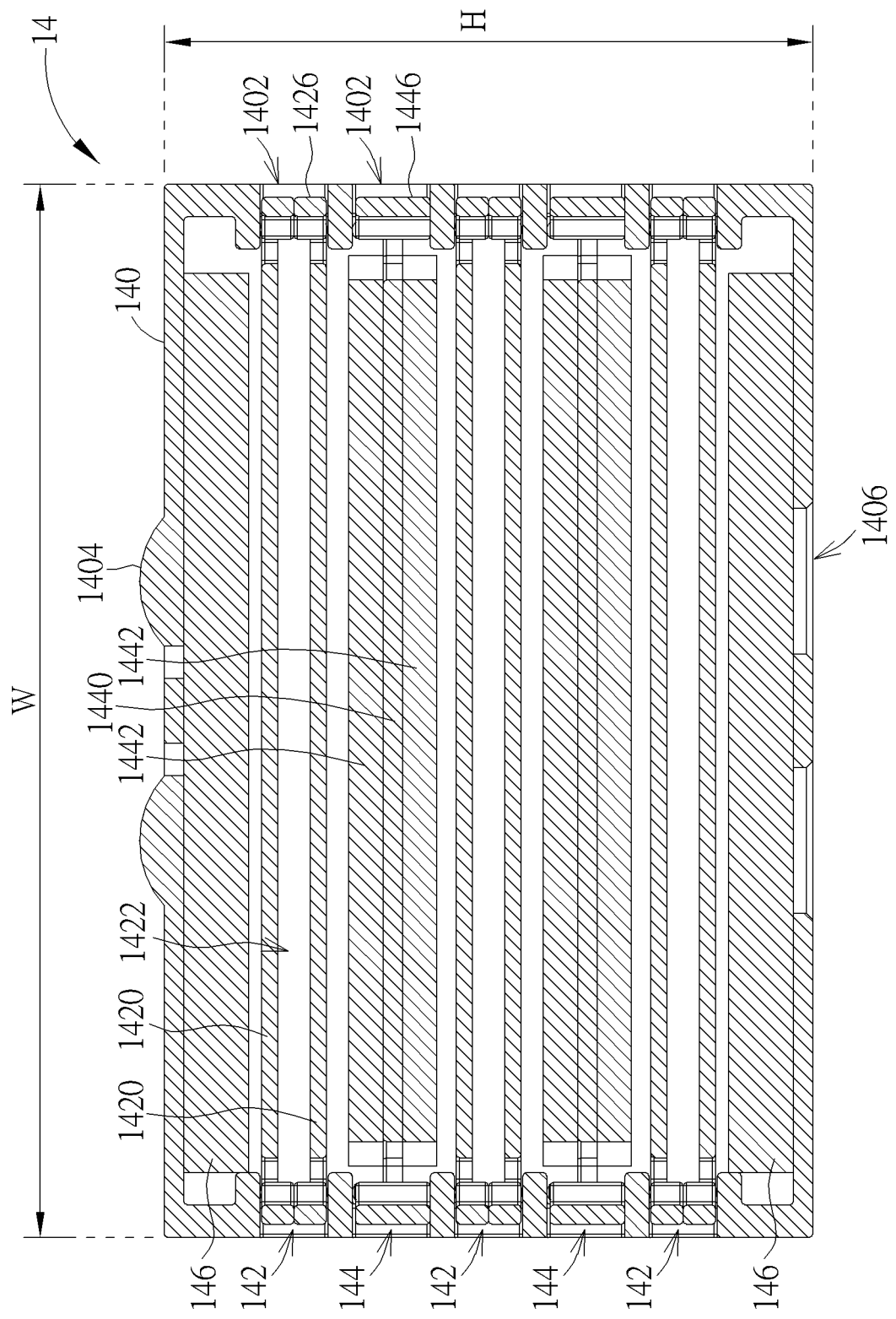
FIG. 4 is a sectional view illustrating the noise reduction module shown in FIG. 2.
Figure 5:
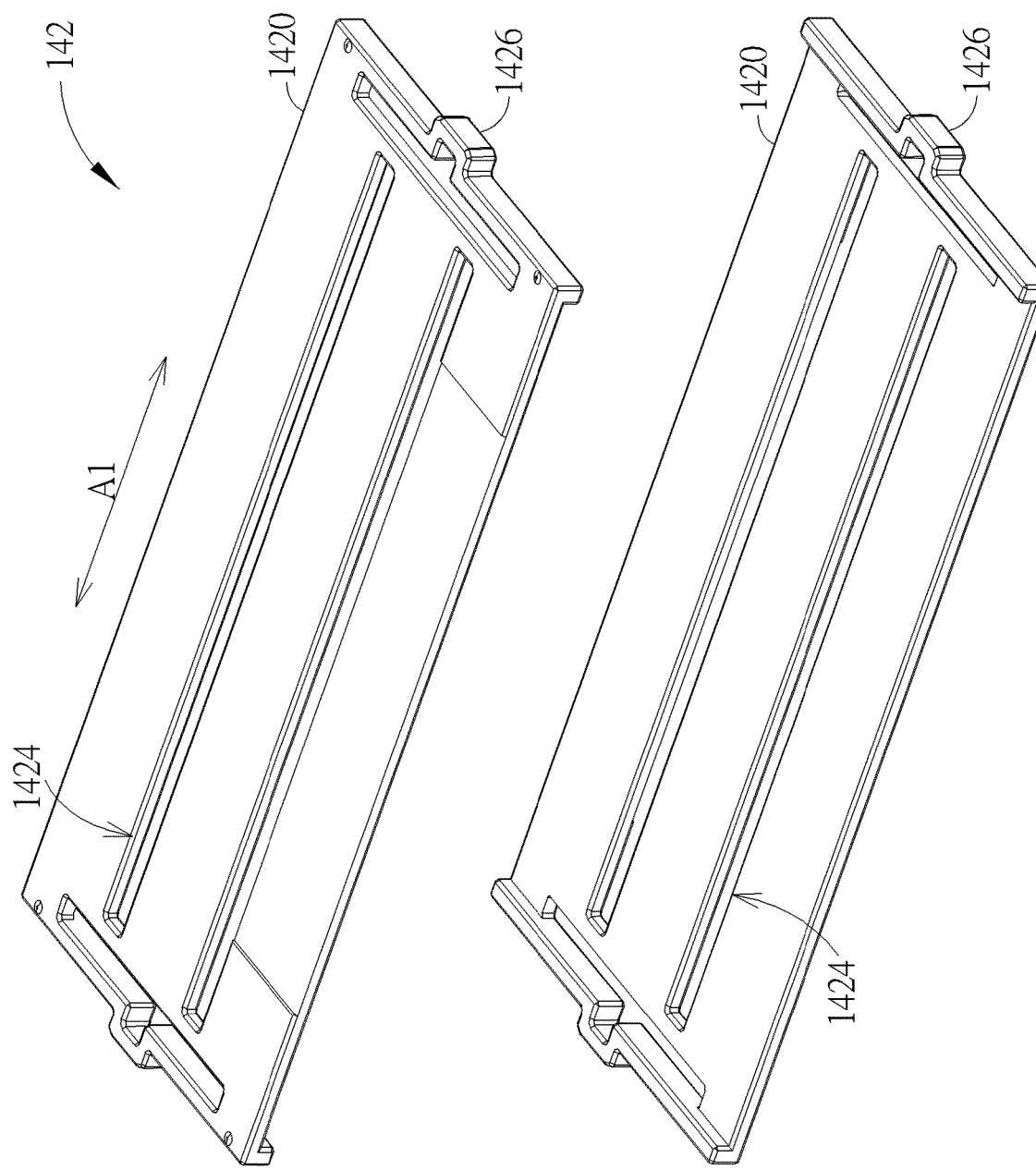
FIG. 5 is an exploded view illustrating a sound weakening mechanism shown in FIG. 3.
Figure 6:
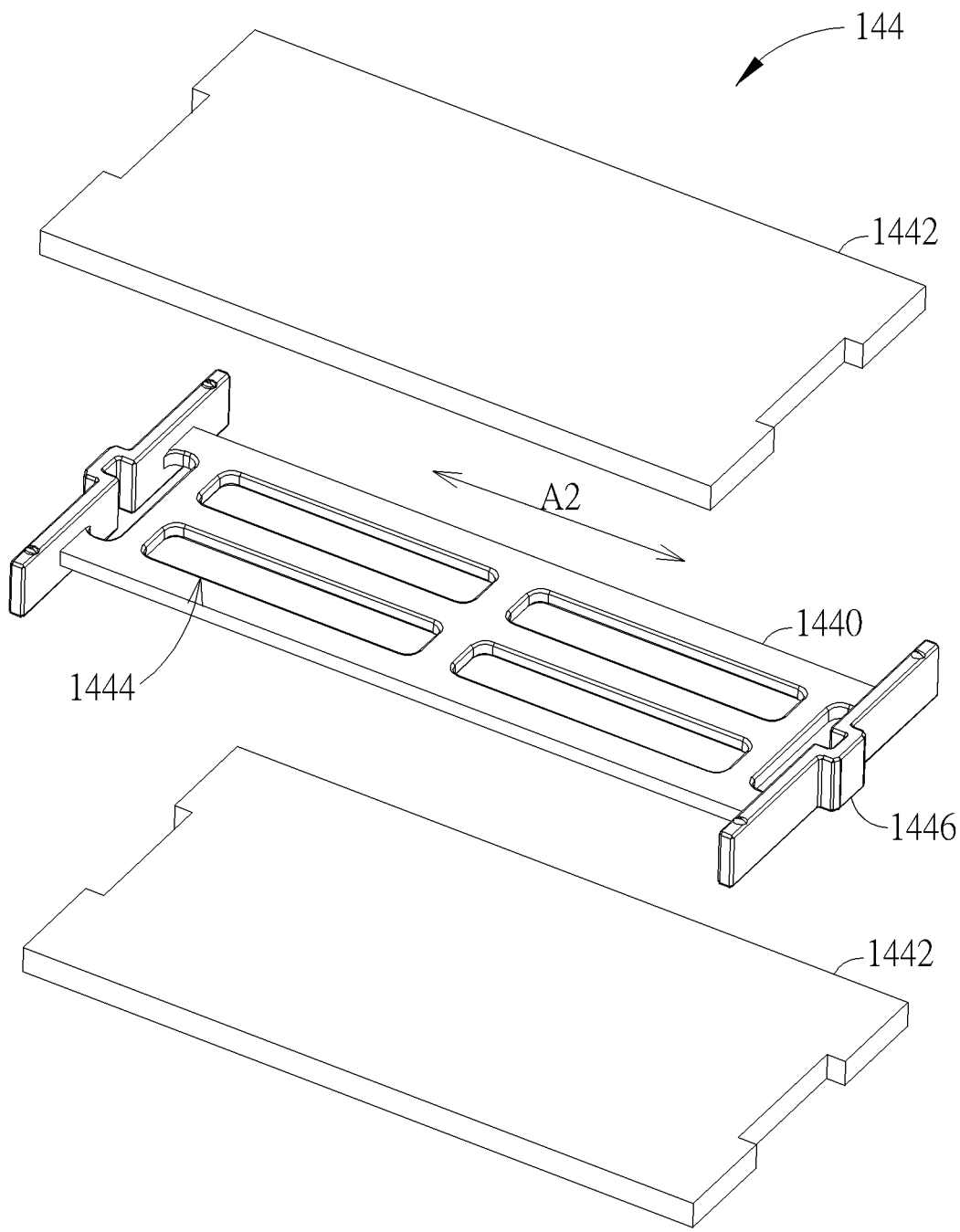
FIG. 6 is an exploded view illustrating a sound absorbing mechanism shown in FIG. 3.

Referring to FIGS. 1 to 6, FIG. 1 is a perspective view illustrating an electronic device 1 according to an embodiment of the disclosure, FIG. 2 is a perspective view illustrating a noise reduction module 14 shown in FIG. 1, FIG. 3 is an exploded view illustrating the noise reduction module 14 shown in FIG. 2, FIG. 4 is a sectional view illustrating the noise reduction module 14 shown in FIG. 2 along line X-X, FIG. 5 is an exploded view illustrating a sound weakening mechanism 142 shown in FIG. 3, and FIG. 6 is an exploded view illustrating a sound absorbing mechanism 144 shown in FIG. 3.

As shown in FIG. 1, the electronic device 1 comprises at least one electronic unit 10, at least one airflow generating unit 12 and at least one noise reduction module 14. The airflow generating unit 12 is disposed with respect to the electronic unit 10 and the noise reduction module 14 is disposed between the electronic unit 10 and the airflow generating unit 12. The airflow generating unit 12 is used to generate airflow to dissipate heat from the electronic unit 10. The noise reduction module 14 is used to weaken the airborne noise generated by the airflow generating unit 12, so as to prevent the performance of the electronic unit 10 from being degraded by the airborne noise. The electronic device 1 may be a computer, a server or other electronic devices according to practical applications. In general, the electronic device 1 may be further equipped with some necessary hardware and/or software components for specific purposes, such as processor, memory, power supply, applications, communication module, etc., and it depends on practical applications. In this embodiment, the electronic unit 10 may be a hard disk and the airflow generating unit 12 may be a fan, but the disclosure is not so limited. It should be noted that the number of the electronic units 10, the airflow generating units 12 and the noise reduction modules 14 may be determined according to practical applications, so the disclosure is not limited to the embodiment shown in the figure.

As shown in FIGS. 2 and 3, the noise reduction module 14 comprises a casing 140, at least one sound weakening mechanism 142, at least one sound absorbing mechanism 144 and at least one second sound absorbing structure 146. The sound weakening mechanism 142, the sound absorbing mechanism 144 and the second sound absorbing structure 146 are disposed in the casing 140, wherein the second sound absorbing structure 146 is disposed on an inner surface of the casing 140. The second sound absorbing structure 146 may be made of foam or other sound absorbing materials according to practical applications. In this embodiment, the number of the at least one sound weakening mechanism 142 may be three, the number of the at least one sound absorbing mechanism 144 may be two, and the number of the at least one second sound absorbing structure 146 may be two, wherein the three sound weakening mechanisms 142 and the two sound absorbing mechanisms 144 may be interlacedly arranged between the two second sound absorbing structures 146. It should be noted that the number of the sound weakening mechanisms 142, the sound absorbing mechanisms 144 and the second sound absorbing structures 146 may be determined according to practical applications, so the disclosure is not limited to the embodiment shown in the figure.

In this embodiment, the casing 140 may comprise an upper plate 140a, a lower plate 140b and two side plates 140c, wherein the two side plates 140c connect the upper plate 140a and the lower plate 140b, such that the casing 140 is ring-shaped. The two second sound absorbing structures 146 may be respectively disposed on inner surfaces of the upper plate 140a and the lower plate 140b.

As shown in FIGS. 4 and 5, each of the sound weakening mechanisms comprises two plate members 1420 and a passage 1422 is formed between the two plate members 1420. In this embodiment, the two plate members 1420 may be parallel to each other, but the disclosure is not so limited. Furthermore, each of the two plate members 1420 may have at least one longitudinal groove 1424 and the at least one longitudinal groove 1424 extends along a length direction A1 of the plate member 1420. The longitudinal groove 1424 may improve the noise reduction effect of the sound weakening mechanism 142. In this embodiment, the number of the longitudinal grooves 1424 of each plate member 1420 may be two and the two longitudinal grooves 1424 may be parallel to each other, but the disclosure is not so limited. The number and arrangement of the longitudinal grooves 1424 may be determined according to practical applications.

As shown in FIGS. 4 and 6, each of the sound absorbing mechanisms 144 comprises a bracket 1440 and at least one first sound absorbing structure 1442, and the at least one first sound absorbing structure 1442 is disposed on the bracket 1440. The first sound absorbing structure 1442 may be made of foam or other sound absorbing materials according to practical applications. In this embodiment, each of the sound absorbing mechanisms 144 may comprise two first sound absorbing structures 1442 and the two first sound absorbing structures 1442 are respectively disposed at opposite sides of the bracket 1440, i.e. the bracket 1440 is sandwiched in between the two first sound absorbing structures 1442. Furthermore, the bracket 1440 may have a plurality of through holes 1444 and the through holes 1444 are arranged in at least one row along a length direction A2 of the bracket 1440. When sound passes through the sound absorbing mechanism 144, the through hole 1444 may reflect the sound to keep the noise reduction effect of the sound absorbing mechanism 144. In this embodiment, the number of the through holes 1444 may be four and the four through holes 1444 may be arranged in two rows along the length direction A2 of the bracket 1440, but the disclosure is not so limited. The number and arrangement of the through holes 1444 may be determined according to practical applications.

As shown in FIGS. 2 to 4, the casing 140 may have a plurality of sliding grooves 1400 and opposite sides of the casing 140 may have a plurality of positioning holes 1402, wherein the positions of the positioning holes 1402 correspond to the positions of the sliding grooves 1400. For further illustration, every two positioning holes 1402 are respectively located at opposite sides of the corresponding sliding groove 1400. In this embodiment, the sliding grooves 1400 are located between the two side plates 140c and the positioning holes 1402 are located on the two side plates 140c. The sound weakening mechanisms 142 and the sound absorbing mechanisms 144 are slidably disposed in the sliding grooves 1400. In this embodiment, opposite sides of each of the sound weakening mechanisms 142 may respectively have a first elastic positioning portion 1426, and opposite sides of each of the sound absorbing mechanisms 144 may respectively have a second elastic positioning portion 1446.

To assemble the noise reduction module 14, a user may attach the two second sound absorbing structures 146 to the inner surfaces of the upper plate 140a and the lower plate 140b of the casing 140 first. Then, the user may insert the three sound weakening mechanisms 142 into the corresponding sliding grooves 1400 of the casing 140, such that the two first elastic positioning portions 1426 of each sound weakening mechanism 142 engage with two of the positioning holes 1402 respectively. Then, the user may insert the two sound absorbing mechanisms 144 into the corresponding sliding grooves 1400 of the casing 140, such that the two second elastic positioning portions 1446 of each sound absorbing mechanism 144 engage with other two of the positioning holes 1402 respectively. The user may press the first elastic positioning portions 1426 and/or the second elastic positioning portions 1446 to disengage the first elastic positioning portions 1426 and/or the second elastic positioning portions 1446 from the positioning holes 1402, so as to remove the sound weakening mechanisms 142 and/or the sound absorbing mechanisms 144 from the casing 140.

When the airborne noise generated by the airflow generating unit 12 passes through the noise reduction module 14, the sound weakening mechanism 142 reduces the energy of the sound conducted to the electronic unit 10 and the sound absorbing mechanism 144 absorbs and reflects the energy of the sound, thereby reducing the energy of the sound. Accordingly, the airborne noise can be effectively weakened to prevent the performance of the electronic unit 10 from being degraded by the airborne noise. Furthermore, the passage 1422 of the sound weakening mechanism 142 can keep the percentage of open area of the noise reduction module 14 at a specific percentage, so as to prevent the airflow resistance from greatly increasing to affect the heat dissipation efficiency. In this embodiment, the percentage of open area of the noise reduction module 14 may be between 30% and 50%. Preferably, the percentage of open area of the noise reduction module 14 may be 40% (as shown in FIG. 4). It should be noted that the percentage of open area of the noise reduction module 14 may be determined according to practical noise reduction requirement.

In this embodiment, the sound weakening mechanisms 142, the sound absorbing mechanisms 144 and the second sound absorbing structures 146 may be disposed in the casing 140 in parallel. At this time, each of the sound weakening mechanisms 142 is parallel to a bottom of the casing 140. In another embodiment, each of the sound weakening mechanisms 142 may be inclined with an angle relative to the bottom of the casing 140, and the angle is smaller than 15 degrees, so as to adjust the noise reduction effect of the noise reduction module 14.

In this embodiment, a width W of the casing 140 may be between 60 mm and 70 mm or between 95 mm and 105 mm, a height H of the casing 140 may be between 38 mm and 42 mm, and a depth D of the casing 140 may be between 25 mm and 35 mm. As shown in FIG. 2, the width W of the casing 140 may be 65 mm, the height H of the casing 140 may be 40 mm, and the depth D of the casing 140 may be 30 mm. Accordingly, the disclosure may modularize the noise reduction module 14 to stack a specific number of noise reduction modules 14 according to the size of the space between the electronic unit 10 and the airflow generating unit 12 and the practical noise reduction requirement. Thus, the noise reduction module 14 may be applied to different systems to increase flexibility in use.

In this embodiment, a side of the casing 140 may have at least one elastic protrusion 1404 and another side of the casing 140 may have at least one avoidance hole 1406, wherein a position of the at least one elastic protrusion 1404 corresponds to a position of the at least one avoidance hole 1406. As shown in FIG. 3, a side of the casing 140 may have two elastic protrusions 1404 and another side of the casing 140 may have two avoidance holes 1406, but the disclosure is not so limited. In this embodiment, the elastic protrusions 1404 are located on the upper plate 140a and the avoidance holes 1406 are located on the lower plate 140b. The number of the elastic protrusions 1404 and the avoidance holes 1406 may be determined according to practical applications. When the noise reduction module 14 is disposed in a chassis 16 of the electronic device 1, the elastic protrusions 1404 of the noise reduction module 14 may abut against the inner top surface (not shown) of the chassis 16 to absorb the gap between the noise reduction module 14 and the inner top surface of the chassis 16. Accordingly, the noise reduction module 14 can be stably disposed in the chassis 16 of the electronic device 1. Furthermore, when two noise reduction modules 14 are stacked from top to bottom, the elastic protrusions 1404 of the lower noise reduction module 14 may be accommodated in the avoidance holes 1406 of the upper noise reduction module 14, so as to prevent the upper noise reduction module 14 from interfering with the elastic protrusions 1404 of the lower noise reduction module 14.

Figure 7:
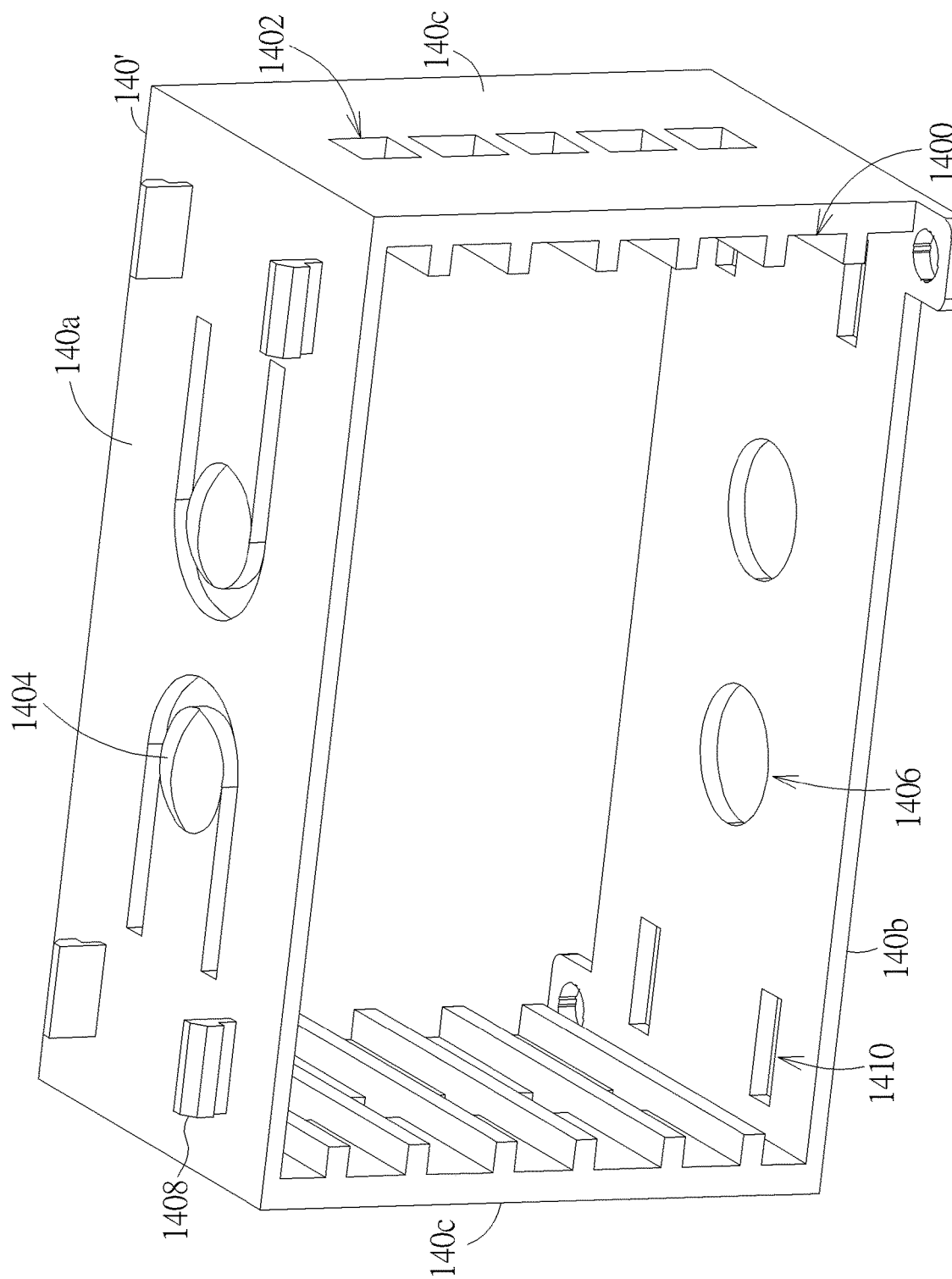
FIG. 7 is a perspective view illustrating a casing according to another embodiment of the disclosure.

Referring to FIG. 7, FIG. 7 is a perspective view illustrating a casing 140' according to another embodiment of the disclosure. As shown in FIG. 7, a side of the casing 140' may have a plurality of engaging hooks 1408 and another side of the casing 140' may have a plurality of engaging holes 1410, wherein the positions of the engaging hooks 1408 correspond to the positions of the engaging holes 1410. In this embodiment, a side of the casing 140' may have four engaging hooks 1408 and another side of the casing 140' may have four engaging holes 1410, but the disclosure is not so limited. The number of the engaging hooks 1408 and the engaging holes 1410 may be determined according to practical applications. The casing 140 shown in FIG. 2 may be replaced by the casing 140' shown in FIG. 7. When two noise reduction modules 14 are stacked from top to bottom, the engaging hooks 1408 of the lower noise reduction module 14 may engage with the engaging holes 1410 of the upper noise reduction module 14, so as to fix the two noise reduction modules 14. Furthermore, as shown in FIG. 3, each of the second sound absorbing structures 146 may have a plurality of recesses 1460, wherein the positions of the recesses 1460 correspond to the positions of the engaging holes 1410. In this embodiment, each of the second sound absorbing structures 146 may have four recesses 1460, but the disclosure is not so limited. The number of the recesses 1460 may be determined according to the number of the engaging hooks 1408 and the engaging holes 1410. When two noise reduction modules 14 are stacked from top to bottom, the engaging hooks 1408 may extend into the recesses 1460 to prevent the engaging hooks 1408 from interfering with the second sound absorbing structure 146.

As shown in FIG. 7, the casing 140' may also comprise an upper plate 140a, a lower plate 140b and two side plates 140c, wherein the two side plates 140c connect the upper plate 140a and the lower plate 140b, such that the casing 140' is ring-shaped. The sliding grooves 1400 are located between the two side plates 140c, the positioning holes 1402 are located on the two side plates 140c, the elastic protrusions 1404 and the engaging hooks 1408 are located on the upper plate 140a, and the avoidance holes 1406 and the engaging holes 1410 are located on the lower plate 140b.

As mentioned in the above, the disclosure utilizes the sound weakening mechanism to reduce the energy of the sound conducted to the electronic unit (e.g. hard disk) and utilizes the sound absorbing mechanism to absorb and reflect the energy of the sound, thereby reducing the energy of the sound. Accordingly, the airborne noise can be effectively weakened to prevent the performance of the electronic unit from being degraded by the airborne noise. Furthermore, the passage of the sound weakening mechanism can keep the percentage of open area of the noise reduction module at a specific percentage, so as to prevent the airflow resistance from greatly increasing to affect the heat dissipation efficiency.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A noise reduction module comprising:
a casing comprising an upper plate, a lower plate and two side plates, the two side plates connecting the upper plate and the lower plate;
at least one sound weakening mechanism disposed in the casing, each of the at least one sound weakening mechanism comprising two plate members, a passage being formed between the two plate members; and
at least one sound absorbing mechanism disposed in the casing, each of the at least one sound absorbing mechanism comprising a bracket and at least one first sound absorbing structure, the at least one first sound absorbing structure being disposed on the bracket;
wherein the casing has a plurality of sliding grooves located between the two side plates and a plurality of positioning holes located on the two side plates, the at least one sound weakening mechanism and the at least one sound absorbing mechanism are slidably disposed in the sliding grooves, positions of the positioning holes correspond to positions of the sliding grooves, opposite sides of each of the at least one sound weakening mechanism respectively have a first elastic positioning portion, opposite sides of each of the at least one sound absorbing mechanism respectively have a second elastic positioning portion, the two first elastic positioning portions and the two second elastic positioning portions engage with the positioning holes.

2. The noise reduction module of claim 1, wherein each of the at least one sound weakening mechanism is parallel to a bottom of the casing.

3. The noise reduction module of claim 1, wherein each of the two plate members has at least one longitudinal groove and the at least one longitudinal groove extends along a length direction of the plate member.

4. The noise reduction module of claim 3, wherein a number of the at least one longitudinal groove is two and the two longitudinal grooves are parallel to each other.

5. The noise reduction module of claim 1, wherein the bracket has a plurality of through holes and the through holes are arranged in at least one row along a length direction of the bracket.

6. The noise reduction module of claim 5, wherein a number of the through holes is four and the four through holes are arranged in two rows.

7. The noise reduction module of claim 1, wherein a side of the casing has at least one elastic protrusion, another side of the casing has at least one avoidance hole, and a position of the at least one elastic protrusion corresponds to a position of the at least one avoidance hole.

8. The noise reduction module of claim 1, further comprising at least one second sound absorbing structure disposed on at least one inner surface of the casing.

9. The noise reduction module of claim 8, wherein positions of the engaging hooks correspond to positions of the engaging holes, each of the at least one second sound absorbing structure has a plurality of recesses, and positions of the recesses correspond to positions of the engaging holes.

10. The noise reduction module of claim 8, wherein a number of the at least one sound weakening mechanism is three, a number of the at least one sound absorbing mechanism is two, a number of the at least one second sound absorbing structure is two, and the three sound weakening mechanisms and the two sound absorbing mechanisms are interlacedly arranged between the two second sound absorbing structures.

11. The noise reduction module of claim 1, wherein a number of the at least one first sound absorbing structure is two and the two first sound absorbing structures are respectively disposed at opposite sides of the bracket.

12. The noise reduction module of claim 1, wherein a percentage of open area of the noise reduction module is between 30% and 50%, a width of the casing is between 60 mm and 70 mm or between 95 mm and 105 mm, a height of the casing is between 38 mm and 42 mm, and a depth of the casing is between 25 mm and 35 mm.

13. The noise reduction module of claim 1, wherein each of the at least one sound weakening mechanism is parallel to a bottom of the casing, the noise reduction module further comprises at least one second sound absorbing structure disposed on at least one inner surface of the casing, a number of the at least one sound weakening mechanism is three, a number of the at least one sound absorbing mechanism is two, a number of the at least one second sound absorbing structure is two, the three sound weakening mechanisms and the two sound absorbing mechanisms are interlacedly arranged between the two second sound absorbing structures, and the at least one first sound absorbing structure and the at least one second sound absorbing structure are made of foam.

14. The noise reduction module of claim 13, wherein each of the two plate members has at least one longitudinal groove, the at least one longitudinal groove extends along a length direction of the plate member, the bracket has a plurality of through holes, the through holes are arranged in at least one row along a length direction of the bracket, a side of the casing has at least one elastic protrusion and a plurality of engaging hooks, another side of the casing has at least one avoidance hole and a plurality of engaging holes, a position of the at least one elastic protrusion corresponds to a position of the at least one avoidance hole, positions of the engaging hooks correspond to positions of the engaging holes, each of the at least one second sound absorbing structure has a plurality of recesses, and positions of the recesses correspond to positions of the engaging holes.

15. The noise reduction module of claim 13, wherein the at least one elastic protrusion and the engaging hooks are located on the upper plate, the at least one avoidance hole and the engaging holes are located on the lower plate, and the two second sound absorbing structures are respectively disposed on inner surfaces of the upper plate and the lower plate.

16. An electronic device comprising:
at least one electronic unit;
at least one airflow generating unit disposed with respect to the at least one electronic unit; and
at least one noise reduction module disposed between the at least one electronic unit and the at least one airflow generating unit, each of the at least one noise reduction module comprising:
a casing comprising an upper plate, a lower plate and two side plates, the two side plates connecting the upper plate and the lower plate;
at least one sound weakening mechanism disposed in the casing, each of the at least one sound weakening mechanism comprising two plate members, a passage being formed between the two plate members; and
at least one sound absorbing mechanism disposed in the casing, each of the at least one sound absorbing mechanism comprising a bracket and at least one first sound absorbing structure, the at least one first sound absorbing structure being disposed on the bracket;
wherein the casing has a plurality of sliding grooves located between the two side plates and a plurality of positioning holes located on the two side plates, the at least one sound weakening mechanism and the at least one sound absorbing mechanism are slidably disposed in the sliding grooves, positions of the positioning holes correspond to positions of the sliding grooves, opposite sides of each of the at least one sound weakening mechanism respectively have a first elastic positioning portion, opposite sides of each of the at least one sound absorbing mechanism respectively have a second elastic positioning portion, the two first elastic positioning portions and the two second elastic positioning portions engage with the positioning holes.

17. The electronic device of claim 16, wherein each of the at least one sound weakening mechanism is parallel to a bottom of the casing, the noise reduction module further comprises at least one second sound absorbing structure disposed on at least one inner surface of the casing, a number of the at least one sound weakening mechanism is three, a number of the at least one sound absorbing mechanism is two, a number of the at least one second sound absorbing structure is two, the three sound weakening mechanisms and the two sound absorbing mechanisms are interlacedly arranged between the two second sound absorbing structures, and the at least one first sound absorbing structure and the at least one second sound absorbing structure are made of foam.

18. The electronic device of claim 17, wherein each of the two plate members has at least one longitudinal groove, the at least one longitudinal groove extends along a length direction of the plate member, the bracket has a plurality of through holes, the through holes are arranged in at least one row along a length direction of the bracket, a side of the casing has at least one elastic protrusion and a plurality of engaging hooks, another side of the casing has at least one avoidance hole and a plurality of engaging holes, a position of the at least one elastic protrusion corresponds to a position of the at least one avoidance hole, positions of the engaging hooks correspond to positions of the engaging holes, each of the at least one second sound absorbing structure has a plurality of recesses, and positions of the recesses correspond to positions of the engaging holes.

* * * * *